(12) United States Patent
Lee et al.

(10) Patent No.: US 7,474,578 B2
(45) Date of Patent: Jan. 6, 2009

(54) REFRESH CONTROL CIRCUIT AND METHOD THEREOF AND BANK ADDRESS SIGNAL CHANGE CIRCUIT AND METHODS THEREOF

(75) Inventors: Jong-Won Lee, Seoul (KR); Tao-Seong Jang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 211 days.

(21) Appl. No.: 11/332,477

(22) Filed: Jan. 17, 2006

(65) Prior Publication Data

US 2006/0250874 A1 Nov. 9, 2006

(30) Foreign Application Priority Data

Jan. 17, 2005 (KR) .................... 10-2005-0004060

(51) Int. Cl.
*G11C 7/00* (2006.01)
*G11C 8/00* (2006.01)
(52) U.S. Cl. .................... 365/222; 365/230.03
(58) Field of Classification Search ............... 365/222
See application file for complete search history.

(56) References Cited

U.S. PATENT DOCUMENTS

| | | | | |
|---|---|---|---|---|
| 6,590,822 B2 * | 7/2003 | Hwang et al. | ............... | 365/222 |
| 6,721,223 B2 * | 4/2004 | Matsumoto et al. | ......... | 365/222 |
| 6,760,806 B2 * | 7/2004 | Jeon | ........................... | 711/106 |
| 6,920,523 B2 * | 7/2005 | Le et al. | ..................... | 711/106 |
| 6,930,943 B2 * | 8/2005 | Kim | ........................... | 365/222 |
| 6,977,857 B2 * | 12/2005 | Mori et al. | ................... | 365/222 |
| 7,251,192 B2 * | 7/2007 | Walker | ....................... | 365/222 |
| 2002/0048208 A1 * | 4/2002 | Mizugaki | .................... | 365/222 |
| 2002/0138690 A1 | 9/2002 | Simmonds et al. | | |
| 2003/0081485 A1 * | 5/2003 | Matsumoto et al. | ......... | 365/222 |
| 2003/0185078 A1 * | 10/2003 | Tsukude | .................... | 365/222 |
| 2004/0068604 A1 | 4/2004 | Le et al. | | |
| 2006/0087903 A1 * | 4/2006 | Riho et al. | .................. | 365/222 |
| 2006/0250873 A1 * | 11/2006 | Hosokawa et al. | .......... | 365/222 |

* cited by examiner

*Primary Examiner*—Son L Mai
(74) *Attorney, Agent, or Firm*—Harness, Dickey & Pierce, P.L.C.

(57) ABSTRACT

A refresh control circuit and method thereof and a bank address signal change circuit and methods thereof. The bank address signal change circuit may receive bank address signals from a bank address signal generation circuit. The received bank address signals may designate a first at least one of a plurality of memory banks. The bank address signal change circuit may determine whether the first at least one designated memory bank is associated with the longest refresh cycles from among the plurality of memory banks. Based on the determination, the bank address signal change circuit may generate a plurality of bank address signal change signals designating a second at least one of the plurality of memory banks. A refresh operation circuit may perform a refreshing operation on the second at least one memory banks in accordance with the bank address signal change signals. The bank address signal generation circuit, bank address signal change circuit and refresh operation circuit may each be included in a refresh control circuit.

7 Claims, 3 Drawing Sheets

REFRESH CONTROL CIRCUIT AND METHOD THEREOF AND BANK ADDRESS SIGNAL CHANGE CIRCUIT AND METHODS THEREOF

PRIORITY STATEMENT

This application claims the benefit of Korean Patent Application No. 10-2005-0004060, filed Jan. 17, 2004, the disclosure of which is hereby incorporated herein by reference in its entirety.

BACKGROUND OF THE INVENTION

1. Field of the Invention

The present invention relates generally to a refresh control circuit and method thereof and a bank address signal change circuit and methods thereof, and more particularly to a refresh control circuit with reduced power consumption and method thereof and a bank address signal change circuit with reduced power consumption and methods thereof.

2. Description of the Related Art

In a conventional semiconductor memory device, such as a dynamic random access memory (DRAM), a current leakage may affect data stored in a memory cell. Memory cells of the semiconductor memory device may be periodically refreshed with a refreshing operation to recharge or refresh the data stored in the memory cells. The refreshing operation may be performed by controlling an internal address of the semiconductor memory device, where the internal address may be adjusted during the refreshing operation by a command signal (e.g., an externally received command signal).

Conventional semiconductor memory devices may include a plurality of memory banks on each of a plurality of memory chips. Each of the plurality of memory banks may store a given amount of data (e.g., in a plurality of memory cells). In an example, a power consumption of a semiconductor memory device may be reduced so as to conform to power requirements in application-specific devices (e.g., a Pentium-level computer, a wireless telephone, a data bank, a personal data assistance (PDA) system, etc.).

The refreshing operation may be performed at each of the plurality of memory banks irrespective of whether data is actually stored in memory cells of a refreshed memory bank, which may reduce an efficiency of the refreshing operation due to wasteful refreshes of memory cells not including data.

A Partial Array Self Refresh (PASR) operation may reduce an inefficiency of the refreshing operation due to wasteful refreshes. The PASR operation may include performing the refreshing operation only on memory banks with memory cells storing data, which may reduce a number of wasteful refreshes.

Each of FIGS. 1, 2 and 3 illustrates a conventional semiconductor memory device having memory banks 10a, 10b, 10c and 10d, where the PASR operation is applied to at least one of the memory banks 10a/10b/10c/10c In each of FIGS. 1, 2 and 3, during the PASR operation, a refreshing operation area may be selected by a Mode Register Set (MRS) code signal. The MRS code signal may indicate a full array mode, a half array mode, a quarter array mode or other mode, as will be described below with respect to FIGS. 1, 2 and 3, respectively.

FIG. 1 illustrates the PASR operation operating in accordance with the full array mode in a conventional semiconductor memory device. Referring to FIG. 1, the PASR operation may be set to the full array mode to perform a refreshing operation at each of the memory banks 10a, 10b, 10c and 10d based on bank address signals BA0 and BA1.

FIG. 2 illustrates the PASR operation operating in accordance with the half array mode in a conventional semiconductor device. Referring to FIG. 1, the PASR operation may be set to the half array mode to perform a refreshing operation at the memory banks 10a and 10b based on the bank address signals BA0 and BA1.

FIG. 3 illustrates the PASR operation operating in accordance with the quarter array mode in a conventional semiconductor device. Referring to FIG. 1, the PASR operation may be set to the quarter array mode to perform a refreshing operation at the memory bank 10a based on the bank address signals BA0 and BA1.

Referring to FIGS. 1, 2 and 3, if the first bank address signal BA0 is set to a first logic level (e.g., a higher logic level or logic "1") and the second bank address signal BA1 is set to a second logic level (e.g., a lower logic level or logic "0"), the memory bank 10b may be selected for refreshing by the PASR operation. If the first and second bank address signals BA0 and BA1 are set to the second logic level (e.g., a lower logic level or logic "0"), the memory bank 10a may be selected for refreshing by the PASR operation. If the first address signal BA0 is set to the second logic level and the second address signal BA1 is set to the first logic level, the memory bank 10c may be selected for refreshing by the PASR operation. If the first and second bank address signals BA0 are set to the first logic level, the memory bank 10d may be selected for refreshing by the PASR operation.

As shown in FIGS. 1, 2 and 3, the refreshing operation may be reduced by the PASR operation to apply to less than all of the memory banks by the quarter array mode and the half array mode settings. However, in conventional semiconductor memory devices supporting the PASR operation, the memory bank or banks selected for the refreshing operation in the half array mode and the quarter array mode array mode may be predetermined.

For example, in the half array mode operation, the memory bank 10a and the memory bank 10b may each be refreshed, as illustrated in FIG. 2, and the memory bank 10a may be refreshed in the quarter array mode. Power consumption may increase in conventional semiconductor memory devices employing the PASR operation because different memory banks may have different refresh cycles and selected memory banks for the refreshing operation may have shorter refresh cycles as compared to non-selected memory banks.

SUMMARY OF THE INVENTION

Another example embodiment of the present invention is directed to a refresh control circuit, including a bank address signal generation circuit generating at least one bank address signal, the at least one bank address signal selecting at least one of a plurality of memory banks for a refreshing operation, a bank address signal change circuit receiving the at least one bank address signal and generating at least one bank address change signal based on the at least one bank address signal and a refresh operation circuit performing the refreshing operation in accordance with the at least one bank address change signal.

Another example embodiment of the present invention is directed to a method of controlling a refreshing operation, including generating at least one bank address signal selecting a first set of memory banks for a refreshing operation, generating at least one bank address change signal based at least in part on the at least one bank address signal, the at least one bank address change signal selecting a second set of memory banks for the refreshing operation and performing the refreshing operation in accordance with the at least one bank address change signal.

Another example embodiment of the present invention is directed to a method of controlling a refreshing operation, including receiving at least one bank address signal designating a first set of memory banks among a plurality of memory banks, determining whether the first set of memory banks have the longest refresh cycles from among the plurality of memory banks and generating at least one bank address change signal based on the determining.

Another example embodiment of the present invention is directed to a bank address signal change circuit, including a receiver receiving a bank address signal designating a first set of memory banks among a plurality of memory banks, a determiner determining whether the first set of memory banks have the longest refresh cycles from among the plurality of memory banks and a generator generating at least one bank address change signal based on the determining.

Another example embodiment of the present invention is directed to a method of controlling a refreshing operation, including determining a first set of memory banks with the longest refresh cycles from among a plurality of memory banks, each of the first set of memory banks having an associated refresh cycle and performing a refreshing operation at each of the first set of memory banks in accordance with a shortest of the associated refresh cycles.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
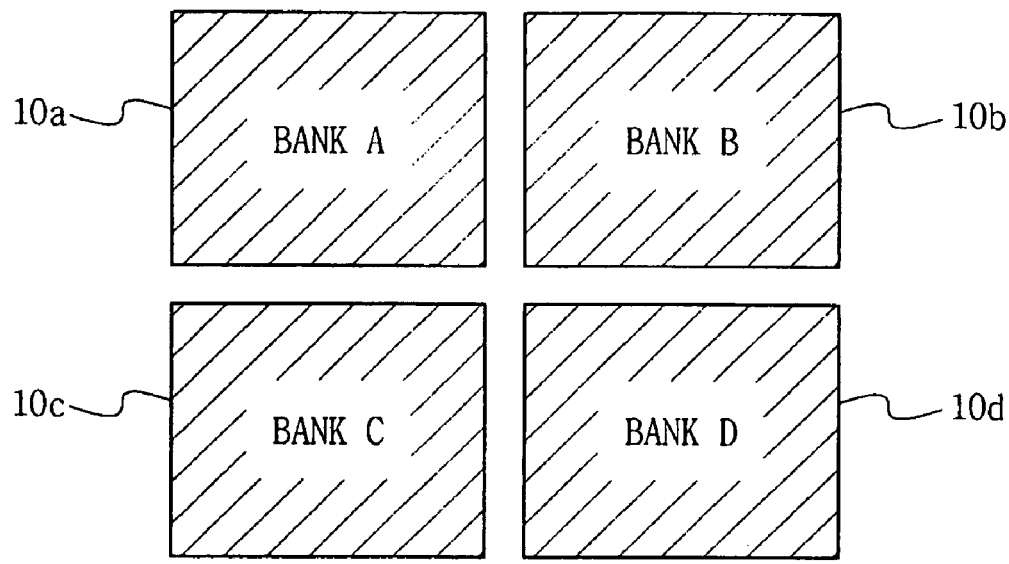
FIG. 1 illustrates a Partial Array Self Refresh (PASR) operation operating in accordance with the full array mode in a conventional semiconductor memory device.
Figure 2:
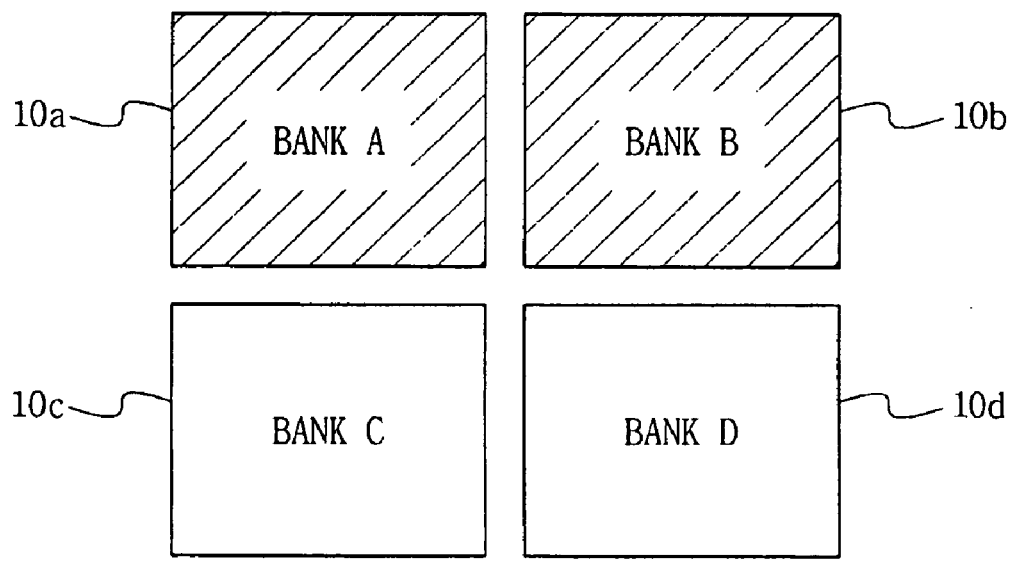
FIG. 2 illustrates the PASR operation operating in accordance with a half array mode in the conventional semiconductor device.
Figure 3:
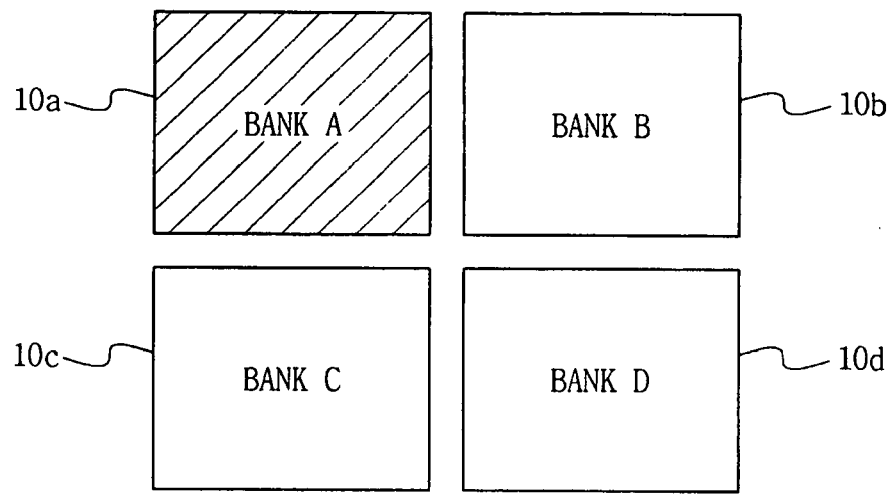
FIG. 3 illustrates the PASR operation operating in accordance with a quarter array mode in the conventional semiconductor device.

Hereinafter, example embodiments of the present invention will be described in detail with reference to the accompanying drawings.

In the Figures, the same reference numerals are used to denote the same elements throughout the drawings.

Figure 4:
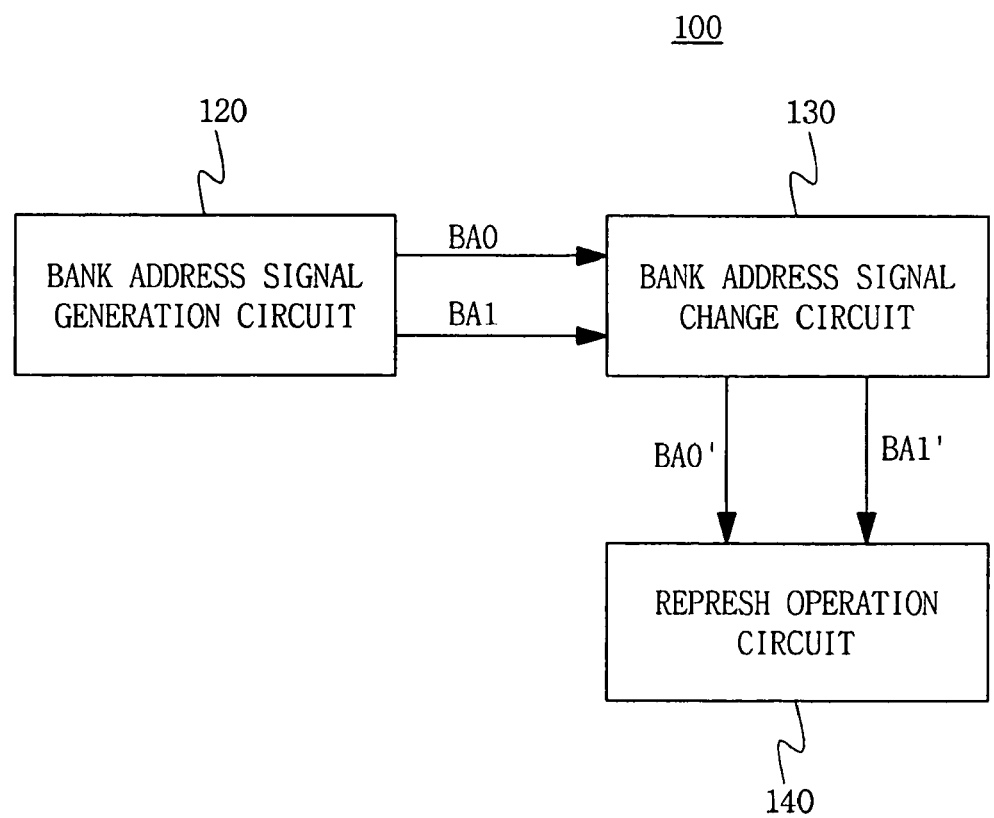
FIG. 4 is a block diagram illustrating a refresh control circuit according to an example embodiment of the present invention.

FIG. 4 is a block diagram illustrating a refresh control circuit 100 according to an example embodiment of the present invention. In the example embodiment of FIG. 4, the refresh control circuit 100 may include a bank address signal generation circuit 120, a bank address signal change circuit 130 and a refresh operation circuit 140.

In the example embodiment of FIG. 4, the refresh control circuit 100 may be included within a semiconductor memory device (not shown). The semiconductor memory device including the refresh control circuit 100 may include a plurality of memory banks, with each of the plurality of memory banks including a plurality of memory blocks with a plurality of memory cells. The plurality of memory banks may be configured to support a Partial Array Self Refresh (PASR) operation. A maximum refresh cycle (e.g., a period or frequency at which a refreshing operation may be performed) for each of the plurality of memory banks may be set through a test operation.

In the example embodiment of FIG. 4, the PASR operation may be set to operate in accordance with one of a plurality of PASR modes. The PASR mode may be selected by a Mode Register Set (MRS) code. In an example, the PASR mode may include, but is not limited to, a full array mode, a half array mode and a quarter array mode.

In the example embodiment of FIG. 4, the bank address signal generation circuit 120 may generate bank address signals BA0 and BA1. Logic levels of the bank address signals BA0 and BA1 may be set to select at least one of the plurality of memory banks (not shown) at which to perform the refreshing operation.

In the example embodiment of FIG. 4, the bank address signal change circuit 130 may generate bank address change signals BA0' and BA1' in order to select memory banks for the refreshing operation. The generated bank address change signals BA0' and BA1' may select memory banks having longer refresh cycles based on the bank address signals BA0 and BA1.

For example, if the bank address signals BA0 and BA1 are set so as to designate a single memory bank (e.g., in quarter array mode) not having a longest refresh cycle from among the plurality of memory banks, the bank address signals BA0 and BA1 may be adjusted by the bank address signal change circuit 130 to output the bank address change signals BA0' and BA1' so as to designate a memory bank having a longer (e.g., the longest) refresh cycle from among the plurality of memory banks. In an alternative example, if the bank address signals BA0 and BA1 are set to as to designate a single memory bank (e.g., in quarter array mode) having the longest refresh cycle from among the plurality of memory banks, the bank address signals BA0 and BA1 may not be adjusted by the bank address signal change circuit 130 and the bank address change signals BA0' and BA1' may match the bank address signal BA0 and BA1.

In another example, if the bank address signals BA0 and BA1 are set to as to designate two memory banks (e.g., in half array mode), the bank address signals BA0 and BA1 may be adjusted by the bank address signal change circuit 130 to output the bank address change signals BA0' and BA1' so as to designate at least one memory bank having a longer (e.g., the longest and the second longest) refresh cycle from among the plurality of memory banks. In an alternative example, if the two memory banks with the longest refresh cycles are selected by the bank address signals BA0 and BA1, the bank address change signals BA0' and BA1' may be generated to match the bank address signals BA0 and BA1.

In the example embodiment of FIG. 4, the refresh operation circuit 140 may perform the refreshing operation on the memory bank or banks with the longer refresh cycle or cycles based on logic levels of the bank address change signals BA0' and BA1'. For example, if the bank address change signals BA0' and BA1' select a single memory bank, the refreshing operation may be performed at the refresh cycle (e.g., a refresh period) of the selected memory bank. Alternatively, if more than one memory bank is selected by the bank address change signals BA0' and BA1', the refreshing operation may be performed at each of the selected memory banks at a shortest refresh cycle of the selected memory banks so as to reduce power consumption.

Figure 5:
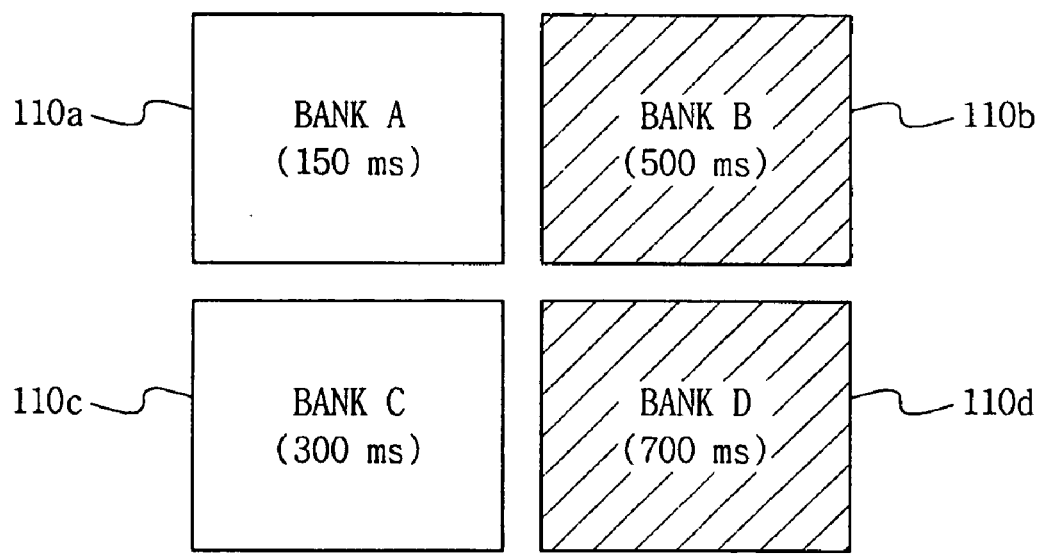
FIG. 5 illustrates a refreshing operation applied to memory banks according to another example embodiment of the present invention.

FIG. 5 illustrates a refreshing operation applied to memory banks 110b and 110d according to another example embodiment of the present invention.

In the example embodiment of FIG. 5, memory banks 110a, 110b, 110c and 100d may be included in a semiconductor memory device (not shown). Example refresh cycles are illustrated in FIG. 5 such that the memory bank 110a may have a refresh cycle of 150 milliseconds (ms), the memory bank 110b may have a refresh cycle of 300 ms, the memory bank 110c may have a refresh cycle of 500 ms and the memory bank 110d may have a refresh cycle of 700 ms. However, it is understood that these illustrated refresh cycles are given for example purposes only, and other example embodiments of the present invention may be directed to memory banks having other refresh cycles.

In the example embodiment of FIG. 5, the bank address signal change circuit 130 may receive the bank address signals BA0 and BA1 from the bank address signal generation circuit 120. The bank address signal change circuit 130 may determine whether to adjust the received bank address signals BA0 and BA1 to generate the bank address change signals BA0' and BA1, respectively. For example, the bank address signal change circuit 130 may determine whether to adjust the received bank address signals BA0 and BA1 based on a refresh cycle criteria. For example, if the bank address signals BA0 and BA1 do not select the memory banks with the longest refresh cycles, the bank address change signals BA0' and BA0' may be adjusted from the bank address signals BA0 and BA1.

In the example embodiment of FIG. 5, the bank address signal change circuit 130 may output the bank address change signals BA0' and BA1' such that the memory bank 10d (e.g., having the longest refresh cycle of 700 ms) and the memory bank 110b (e.g., having the second longest refresh of 500 ms) may be selected for the refreshing operation.

In the example embodiment of FIG. 5, the refreshing operation circuit 140 may perform the refreshing operation for the memory bank 110b and the memory bank 110d in accordance with the bank address change signals BA0' and BA1'. In an example, the refreshing operation circuit 140 may compare the refresh cycles of the memory bank 110b and the memory bank 110d. The refreshing operation circuit 140 may determine, based on the comparison, which of the memory banks 110b and 110d has a shorter refresh cycle. The refreshing operation circuit 140 may perform the refreshing operation on the memory bank 110b and the bank 110d at the shorter refresh cycle.

Figure 6:
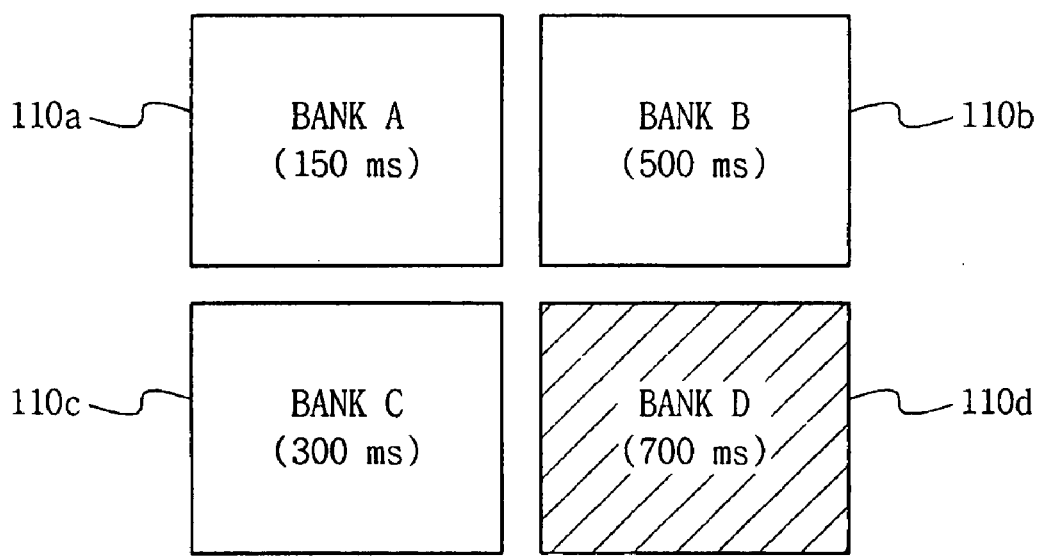
FIG. 6 illustrates a refreshing operation applied to a memory bank according to another example embodiment of the present invention.

FIG. 6 illustrates a refreshing operation applied to the memory bank 110d according to another example embodiment of the present invention.

In the example embodiment of FIG. 6, the MRS code may designate a quarter array mode operation for the refreshing operation as described above with respect to conventional FIG. 1. The bank address signal generation circuit 120 may generate the bank address signals BA0 and BA1 to select the memory bank 110a for the refreshing operation. The bank address signal change circuit 130 may receive the bank address signals BA0 and BA1 designating the memory bank 110a and may adjust the received bank address signals so as to generate the bank address change signals BA0' and BA1' which may select the memory bank with a longer refresh cycle (e.g., a longest refresh cycle). The bank address signal change circuit 130 may thereby generate the bank address change signals BA0' and BA1' so as to select the memory bank 110d (e.g., with the longer refresh cycle of 700 ms).

In the example embodiment of FIG. 6, the refreshing operation circuit 140 may receive the bank address change signals BA0' and BA1' from the bank address signal change circuit 130. The refreshing operation circuit 140 may perform the refreshing operation on the memory bank 110d in accordance with the bank address change signals BA0' and BA1'.

In the example embodiments of FIGS. 5 and 6, while the bank address signal generation circuit 120 may generate bank address signals BA0 and BA1 in accordance with the conventional art, the bank address signal change circuit 130 may adjust the bank address signals BA0 and BA1 so as to adjust the selected memory banks based on a refresh cycle criteria (e.g., a period of a refresh cycle).

In another example embodiment of the present invention, a semiconductor memory device with a plurality of memory banks may include a refresh control circuit for selectively controlling a refreshing of the plurality the memory banks based on refresh cycle criteria. In an example, if bank address signals designate less than all of the memory banks for refreshing, the bank address signals may be adjusted such that memory banks with longer refresh cycles may be refreshed in favor of memory banks with lower refresh cycles.

In another example embodiment of the present invention, while not shown in FIG. 4, the bank address signal change circuit 130 may include a receiver, a determiner and a generator for performing the example operations described above with respect to FIGS. 4, 5 and 6. For example, the receiver may be configured to receive the bank address signals BA0 and BA1, the determiner may be configured to determine whether the bank address signal change signals BA0' and BA1' may be adjusted to select/designate a different set of memory banks for the refreshing operation, and the generator may generate the bank address signal change signals BA0' and BA1' in accordance with the determining. For example, if the determiner determines that there are no longer refresh cycles of memory banks as compared to the memory banks indicated by the bank address signals BA0 and BA1, the generator may generate bank address change signals BA0' and BA1' matching the bank address signals BA0 and BA1, respectively. Alternatively, if the determiner determines that there are longer refresh cycles associated with memory banks other than the memory banks indicated by the bank address signals BA0 and BA1, the bank address change signals BA0' and BA1' may be adjusted from the bank address signals BA0 and BA1 so as to designate the memory banks with the longer refresh cycles, for example as illustrated in FIGS. 5 and 6.

Example embodiments of the present invention being thus described, it will be obvious that the same may be varied in many ways. For example, it is understood that the above-described first and second logic levels may correspond to a higher logic level (e.g., logic "1") and a lower logic level (e.g., logic "0"), respectively, in an example embodiment of the present invention. Alternatively, the first and second logic levels may correspond to the lower logic level (e.g., logic "0") and the higher logic level (e.g., logic "1"), respectively, in other example embodiments of the present invention.

Further, while above described with respect to one of a full array mode, a half array mode and a quarter array mode, it is understood that other example embodiments of the present invention may be directed to a refresh control circuit and/or a bank address signal change circuit operating in accordance to any mode of operation.

Such variations are not to be regarded as departure from the spirit and scope of example embodiments of the present invention, and all such modifications as would be obvious to one skilled in the art are intended to be included within the scope of the following claims.

What is claimed is:

1. A method of controlling a refreshing operation, comprising:
   receiving at least one bank address signal designating a first set of memory banks among a plurality of memory banks;
   determining whether the first set of memory banks have the longest refresh cycles from among the plurality of memory banks; and
   generating at least one bank address change signal based on the determimng;
   wherein each of the plurality of memory banks includes a plurality of memory blocks including a plurality of memory cells, and
   wherein a refreshing operation of at least one set of memory banks among the plurality of memory banks is performed directly in response to the at least one bank address change signal.

2. The method of claim 1, wherein the generating generates the at least one bank address change signal designating a second set of memory banks if the determining determines that the plurality of memory banks includes at least one memory bank having a longer refresh cycle than at least one of the first set of memory banks.

3. The method of claim 1, wherein the generating generates the at least one bank address change signal designating the first set of memory banks if the determining determines that the plurality of memory banks does not include at least one memory bank having a longer refresh cycle than at least one of the first set of memory banks.

4. The method of claim 1, wherein the first set of memory banks includes one memory bank.

5. The method of claim 1, wherein the first set of memory banks includes more than one memory bank.

6. A bank address signal change circuit, comprising:
   a receiver receiving a bank address signal designating a first set of memory banks among a plurality of memory banks, each of the plurality of memory banks including a plurality of memory blocks including a plurality of memory cells;
   a determiner determining whether the first set of memory banks have the longest refresh cycles from among the plurality of memory banks; and
   a generator generating at least one bank address change signal based on the determining.

7. A refresh control circuit including the bank address signal change circuit of claim 6.

* * * * *